(12) United States Patent
Jeon et al.

(10) Patent No.: US 6,607,954 B2
(45) Date of Patent: Aug. 19, 2003

(54) METHODS OF FABRICATING CYLINDER-TYPE CAPACITORS FOR SEMICONDUCTOR DEVICES USING A HARD MASK AND A MOLD LAYER

(75) Inventors: Jeong-sic Jeon, Kyungki-do (KR); Kyeong-koo Chi, Seoul (KR); Chang-jin Kang, Kyungki-do (KR); Jin-hwan Hahm, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/304,273

(22) Filed: Nov. 26, 2002

(65) Prior Publication Data
US 2003/0124796 A1 Jul. 3, 2003

(30) Foreign Application Priority Data
Dec. 29, 2001 (KR) .................... 2001-0088063

(51) Int. Cl.[7] .......................................... H01L 21/8242
(52) U.S. Cl. ................ 438/244; 438/253; 438/387; 438/397
(58) Field of Search .................. 438/241, 242, 438/244, 253, 387, 397, FOR 212

(56) References Cited

U.S. PATENT DOCUMENTS

| | | | |
|---|---|---|---|
| 5,780,338 A | * | 7/1998 | Jeng et al. |
| 5,866,453 A | * | 2/1999 | Prall et al. |
| 5,981,334 A | * | 11/1999 | Chien et al. |
| 6,258,691 B1 | | 7/2001 | Kim |
| 6,303,434 B1 | * | 10/2001 | Parekh et al. |
| 6,461,963 B1 | * | 10/2002 | Givens et al. |
| 6,503,796 B1 | * | 1/2003 | Tu |
| 2002/0005542 A1 | * | 1/2002 | Hayano et al. |
| 2002/0024085 A1 | * | 2/2002 | Nakamura et al. |
| 2002/0106856 A1 | * | 8/2002 | Lee et al. |
| 2002/0142542 A1 | * | 10/2002 | Jeng |
| 2003/0032234 A1 | * | 2/2003 | Suzuki |

* cited by examiner

Primary Examiner—George Fourson
Assistant Examiner—Joannie Adelle Garcia
(74) Attorney, Agent, or Firm—Myers Bigel Sibley & Sajovec

(57) ABSTRACT

A capacitor for a semiconductor memory device is fabricated by forming a mold layer on a semiconductor substrate that includes a peripheral circuit area and a cell array area which includes a plug in a buried contact hole. A hard mask layer pattern is formed on the mold layer. The mold layer is etched, using the hard mask layer pattern as an etch mask, to form a mold layer pattern. The hard mask layer pattern is then removed from the mold layer pattern or only partially etched back on the mold layer pattern. A capacitor lower electrode is formed along the walls of the buried contact hole and on a surface of the mold layer pattern. A capacitor dielectric layer is formed on the capacitor lower electrode and a capacitor upper electrode is formed on the capacitor dielectric layer.

20 Claims, 10 Drawing Sheets

METHODS OF FABRICATING CYLINDER-TYPE CAPACITORS FOR SEMICONDUCTOR DEVICES USING A HARD MASK AND A MOLD LAYER

RELATED APPLICATION

This application claims the benefit of Korean Patent Application No. 2001-88063, filed Dec. 29, 2001, the disclosure of which is hereby incorporated herein by reference in its entirety as if set forth fully herein.

FIELD OF THE INVENTION

The present invention relates to fabrication methods for semiconductor devices, and more particularly to fabrication methods for cylinder-type capacitors in a semiconductor device.

BACKGROUND OF THE INVENTION

Integrated circuit capacitors are widely used in integrated circuit devices. For example, in Dynamic Random Access Memory (DRAM) devices, integrated circuit capacitors may be used to store charge thereon, and thereby store data. As the integration density of integrated circuit devices, such as DRAM devices, continues to increase, it may be desirable to maintain sufficiently high storage capacitance while decreasing the area of the integrated circuit substrate that is occupied by each capacitor.

In order to increase the amount of capacitor per unit area of the integrated circuit substrate, it is known to use three-dimensional capacitor structures that can increase the effective area thereof. One type of three-dimensional capacitor structure is a cylindrical capacitor, also referred to herein as a cylinder-type capacitor. Cylinder-type capacitors are well known to those having skill in the art and are described, for example, in U.S. Pat. No. 6,258,691, entitled Cylindrical Capacitor and Method for Fabricating Same, assigned to the assignee of the present application, the disclosure of which is hereby incorporated herein by reference in its entirety as if set forth fully herein.

As is well known to those having skill in the art, an integrated circuit capacitor generally includes a first or lower electrode, also referred to as a storage node, a dielectric layer on the first or lower electrode, and a second or upper electrode on the dielectric layer opposite the first or lower electrode. In a cylinder-type capacitor, at least part of the lower electrode is cylindrical in shape.

As the integration density of integrated circuit memory devices continues to increase, it may be desirable to increase the height of the cylinder-type capacitor, for example, by increasing the height of the lower electrode in the cylinder-type capacitor. Conventionally, the lower electrode of the cylinder-type capacitor is formed by etching a polysilicon layer using a hard mask layer pattern, rather than a photoresist pattern, as an etch mask. An array of cylinder-type capacitors may be formed in a cell array area of a semiconductor substrate and peripheral circuitry for the memory device may be formed in a peripheral circuit area of the semiconductor substrate.

However, when the polysilicon layer, which forms the lower electrode of the cylinder-type capacitor, is etched by using the hard mask layer pattern as an etch mask, the hard mask layer pattern of a cell array area of the substrate may become thin due to the three-dimensional etching of the array of lower electrodes, while the hard mask layer pattern in a peripheral circuit area of the substrate may remain thick from only one-dimensional etching. Stated differently, the pattern density of the cell array area in the semiconductor device generally is high while the pattern density of the peripheral circuit area generally is low. In any event, a step may be formed between the cell array area and the peripheral circuit area.

When the step is generated between the cell array area and the peripheral circuit area, and the hard mask layer pattern is removed to separate the lower electrodes of the cylinder-type capacitor for the memory cells in subsequent process steps, the height of the cylinder-type capacitor lower electrode in the cell array area may be reduced, and/or the hard mask layer pattern may remain in the peripheral circuit area. Moreover, when separating the lower electrodes of the cylinder-type capacitor for the memory cells, Chemical Mechanical Polishing (CMP) may be used to remove the hard mask layer pattern. However, the cost of the CMP may be high.

SUMMARY OF THE INVENTION

Some embodiments of the present invention provide fabrication methods for a capacitor in a semiconductor device, such as a semiconductor memory device, by forming a mold layer on a semiconductor substrate that includes a peripheral circuit area and a cell array area which includes a plug in a buried contact hole. A hard mask layer pattern is formed on the mold layer. The mold layer is etched, using the hard mask layer pattern as an etch mask, to form a mold layer pattern. In some embodiments, the hard mask layer pattern is then only partially etched back on the mold layer pattern. In other embodiments, the hard mask layer is completely removed from the mold layer pattern. A capacitor lower electrode is formed along the walls of the buried contact hole and on a surface of the mold layer pattern. A capacitor dielectric layer is formed on the capacitor lower electrode and a capacitor upper electrode is formed on the capacitor dielectric layer.

Other embodiments of the present invention successively form an etch stop layer and a mold layer on a semiconductor substrate including a peripheral circuit area and a cell array area in which a plug in a buried contact hole is formed. A hard mask layer pattern then is formed on the mold layer. The hard mask layer pattern comprises a polysilicon layer in some embodiments.

The mold layer and the etch stop layer are etched by using the hard mask layer pattern as an etch mask so that a mold layer pattern and an etch stop layer pattern are formed to expose a surface of the plug. In some embodiments, the etch stop layer comprises a silicon nitride layer, and the mold layer comprises a silicon oxide layer. After forming the mold layer pattern and the etch stop layer pattern, the plug may be further etched.

Then, the hard mask layer pattern is etched back so as to reduce a step between the hard mask layer pattern of the cell array area and the hard mask layer pattern of the peripheral circuit area. When etching back the hard mask layer pattern, the plug may be completely removed in some embodiments, or a portion of the plug may remain in other embodiments. In still other embodiments, a portion of the hard mask layer pattern may remain on the mold layer pattern when etching back the hard mask layer pattern.

A conductive layer for the capacitor lower electrode is formed along the walls of the buried contact hole and on a surface of the mold layer pattern. A sacrificial layer is formed between the buried contact hole and the mold layer pattern. In some embodiments, the sacrificial layer comprises a photoresist layer and/or a silicon oxide layer. In some embodiments, the sacrificial layer is etched back after the formation of the sacrificial layer. The etch back of the sacrificial layer may be performed so that the surface of the sacrificial layer is aligned with or lower than the surface of the mold layer pattern.

A capacitor lower electrode of the cylinder-type is formed by etching back the conductive layer for the capacitor lower electrode. In some embodiments, the hard mask layer pattern remaining on the mold layer pattern is removed when the conductive layer for the capacitor lower electrode is etched back. A cylinder-type capacitor may be completed by removing the mold layer pattern and the sacrificial layer, and forming a capacitor dielectric and upper electrode.

Fabrication methods for a cylinder-type capacitor according to some embodiments of the present invention etch back the hard mask layer pattern during formation of the cylinder-type lower electrode by using the hard mask layer pattern as an etch mask. Accordingly, a step between the hard mask layer pattern of the cell array area and the hard mask layer pattern of the peripheral circuit area can be reduced. As a result, the height of the cylinder-type capacitor lower electrode may not be lowered when separating the cylinder-type capacitor lower electrodes for the memory cells, and the cylinder-type capacitor lower electrodes may be well separated.

DETAILED DESCRIPTION OF PREFERRED EMBODIMENTS

Figure 1:
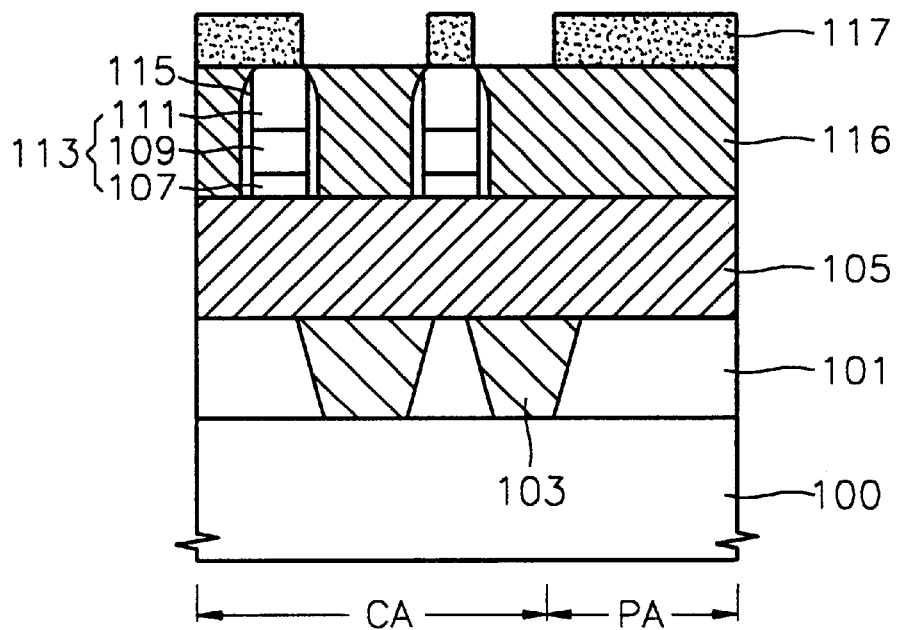
FIGS. 1–11 are cross-sectional views showing fabrication methods for cylinder-type capacitors in a semiconductor device according to embodiments of the present invention.

The present invention now will be described more fully hereinafter with reference to the accompanying figures, in which embodiments of the invention are shown. This invention should not be construed as limited to the embodiments set forth herein. Accordingly, specific embodiments thereof are shown by way of example in the drawings and will herein be described in detail. It should be understood, however, that there is no intent to limit the invention to the particular forms disclosed. Like numbers refer to like elements throughout the description of the figures. In the figures, the dimensions of layers and regions may be exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present.

FIGS. 1 through 11 are cross-sectional views showing fabrication methods for capacitors such as cylinder-type capacitors in a semiconductor device according to embodiments of the present invention.

Referring to FIG. 1, a first interlevel insulating layer 101 is formed on a semiconductor substrate 100, for example a silicon substrate, which is divided into a cell array area CA and a peripheral circuit area PA. The first interlevel insulating layer 101 may comprise a silicon oxide layer. A contact pad 103 is formed in the first interlevel insulating layer 101. A cylinder-type capacitor lower electrode is electrically connected to the contact pad 103, as will be described below. The contact pad 103 may comprise a polysilicon layer.

A second interlevel insulating layer 105 is formed on the first interlevel insulating layer 101 and on the contact pad 103. The second interlevel insulating layer 105 may comprise a silicon oxide layer. A bit line stack 113 and bit line spacers 115 are formed on the second interlevel insulating layer 105. The bit line stack 113 may be formed by successively stacking a barrier metal layer 107, a bit line conductive layer 109, and a bit line capping layer 111. The barrier metal layer 107 may comprise a Ti/TiN layer, and the bit line conductive layer 109 may comprise a bilayer of a polysilicon layer and a silicide layer. The bit line capping layer 111 and the bit line spacers 115 may comprise a silicon nitride layer having an etch selectivity with respect to the silicon oxide layer.

In addition, a third interlevel insulating layer 116 is formed on the second interlevel insulating layer 105, filling the space between the bit line spacers 115. The third interlevel insulating layer 116 may be formed by forming and planarizing an insulating layer, for example a silicon oxide layer, so that the third interlevel insulating layer 116 sufficiently fills the space between the bit line spacers 115. A first photoresist pattern 117 is formed on the third interlevel insulating layer 116 so as to open the space between the bit line spacers 115 by a photo-etching process.

Figure 2:
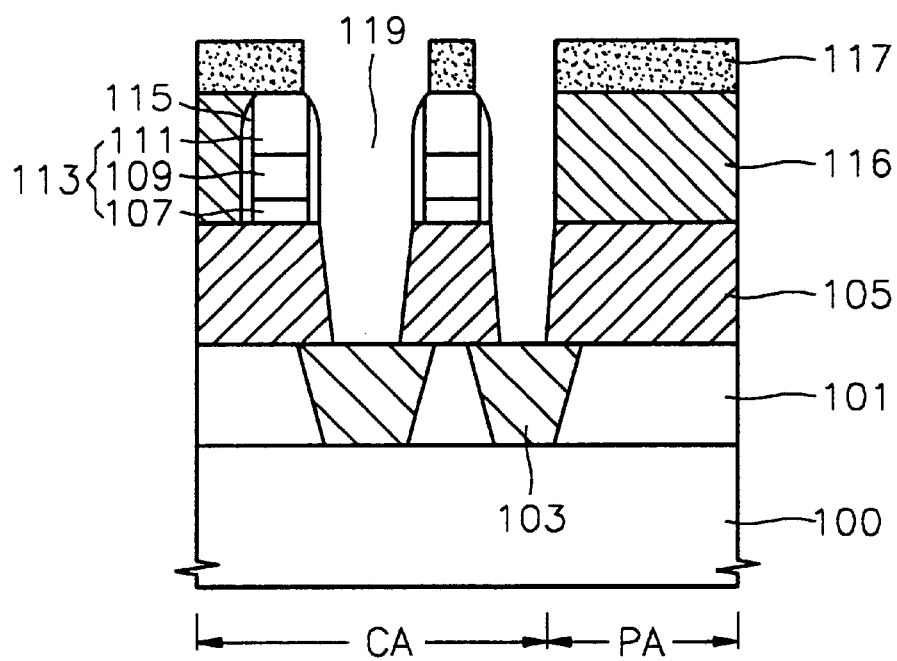

Referring to FIG. 2, the third and second interlevel insulating layers 116 and 105 are etched by using the first photoresist pattern 117 as an etch mask so that a buried contact hole 119 is formed to expose the contact pad 103. In some embodiments, the buried contact hole 119 is self-aligned to the bit line spacers 115. The buried contact hole 119 is used to connect the contact pad 103 with a cylinder capacitor lower electrode, which is formed in a subsequent process. The first photoresist pattern 117, which is used as the etch mask, is removed.

Figure 3:
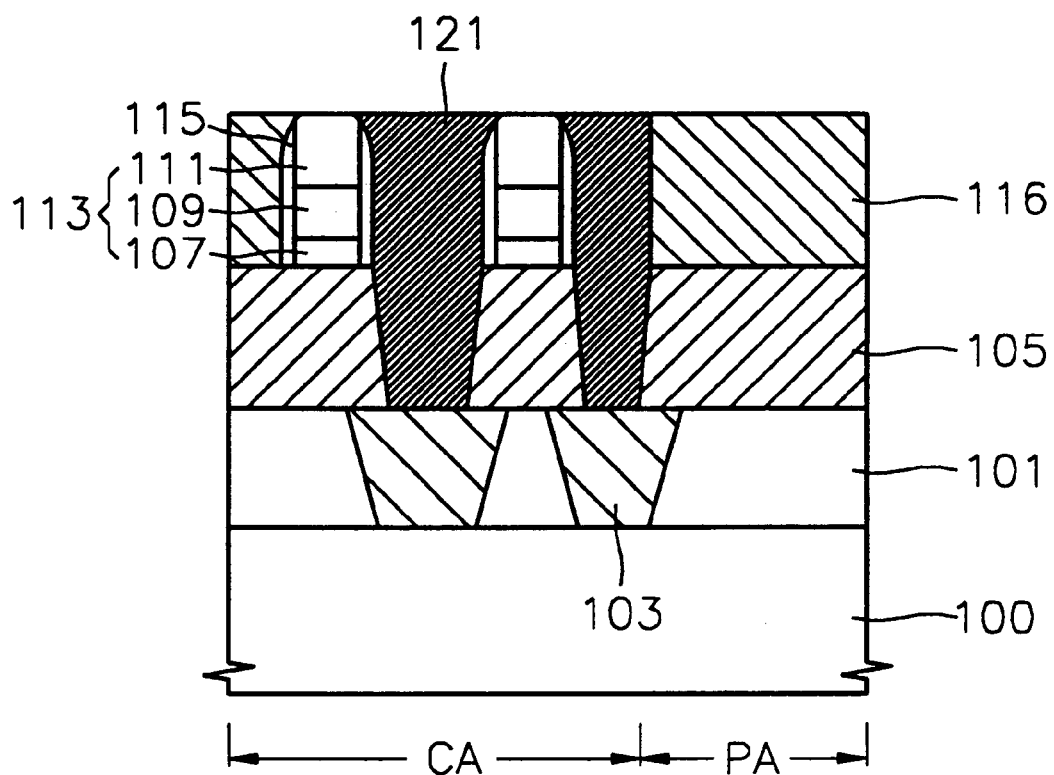

Referring to FIG. 3, a plug 121 is formed in the buried contact hole 119. The plug 121 may be formed by forming and planarizing a polysilicon layer so that the plug is sufficiently buried in the buried contact hole 119.

Figure 4:
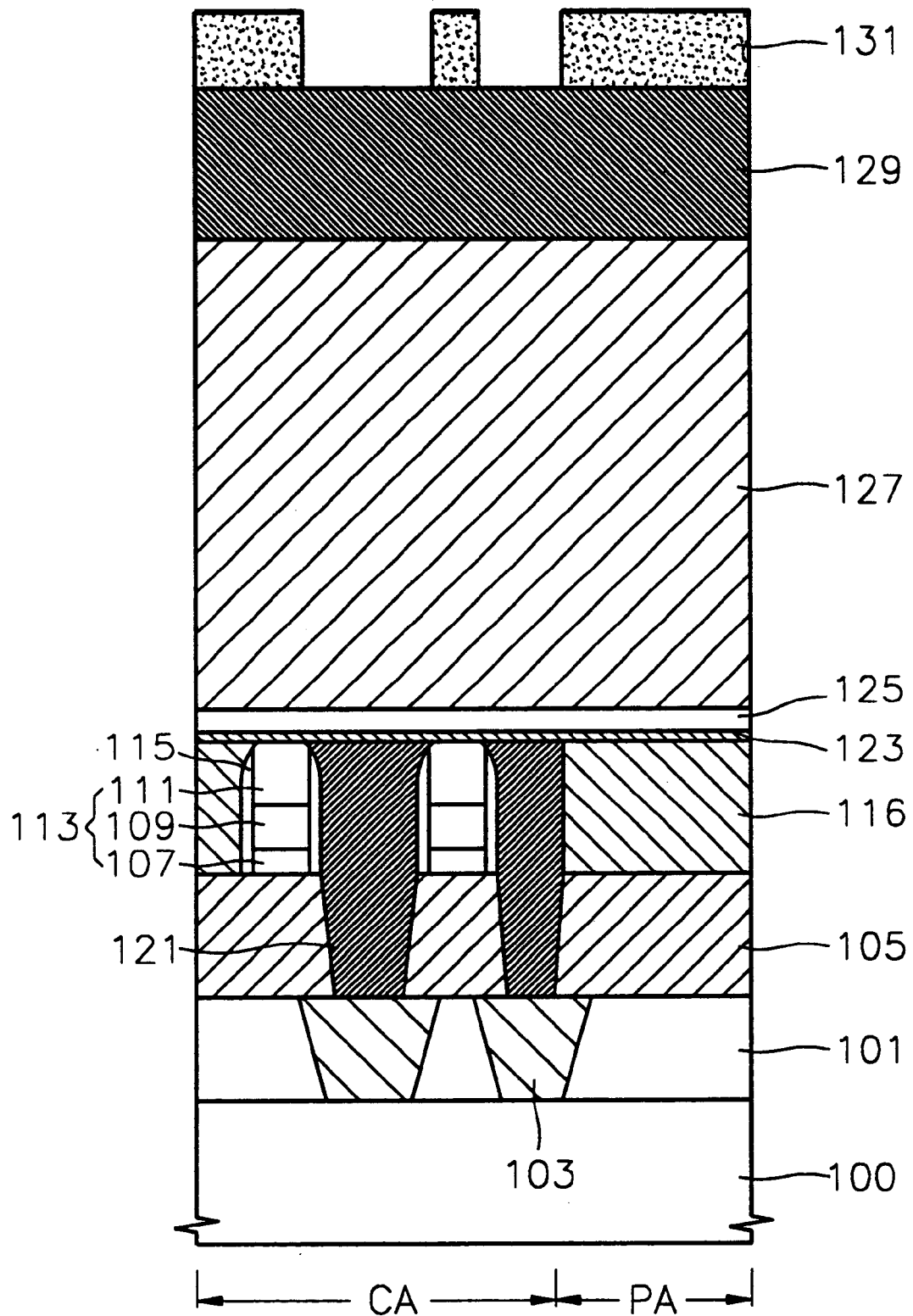

Referring to FIG. 4, a buffer layer 123 and an etch stop layer 125 are formed on the semiconductor substrate 100 on which the plug 121 is formed. The buffer layer 123 may comprise a silicon oxide layer of a thickness of about 500 Å, and the etch stop layer 125 may comprise a silicon nitride layer of a thickness of about 500 Å. In other embodiments, the buffer layer 123 and/or the etch stop layer 125 may not be used.

Then, a mold layer 127 is formed on the etch stop layer 125. The mold layer 127 may comprise a silicon oxide layer of a thickness of between about 10,000 Å and about 20,000 Å and, in some embodiments, is about 15,000 Å. Other dielectric and/or conductive materials may be used. A hard mask layer 129 is formed on the mold layer 127. The hard mask layer 129 may comprise a polysilicon layer of a thickness of between about 2,000 Å and about 3,000 Å. Next, a second photoresist pattern 131 is formed on the hard mask layer 129 by a photo-etching process.

Figure 5:
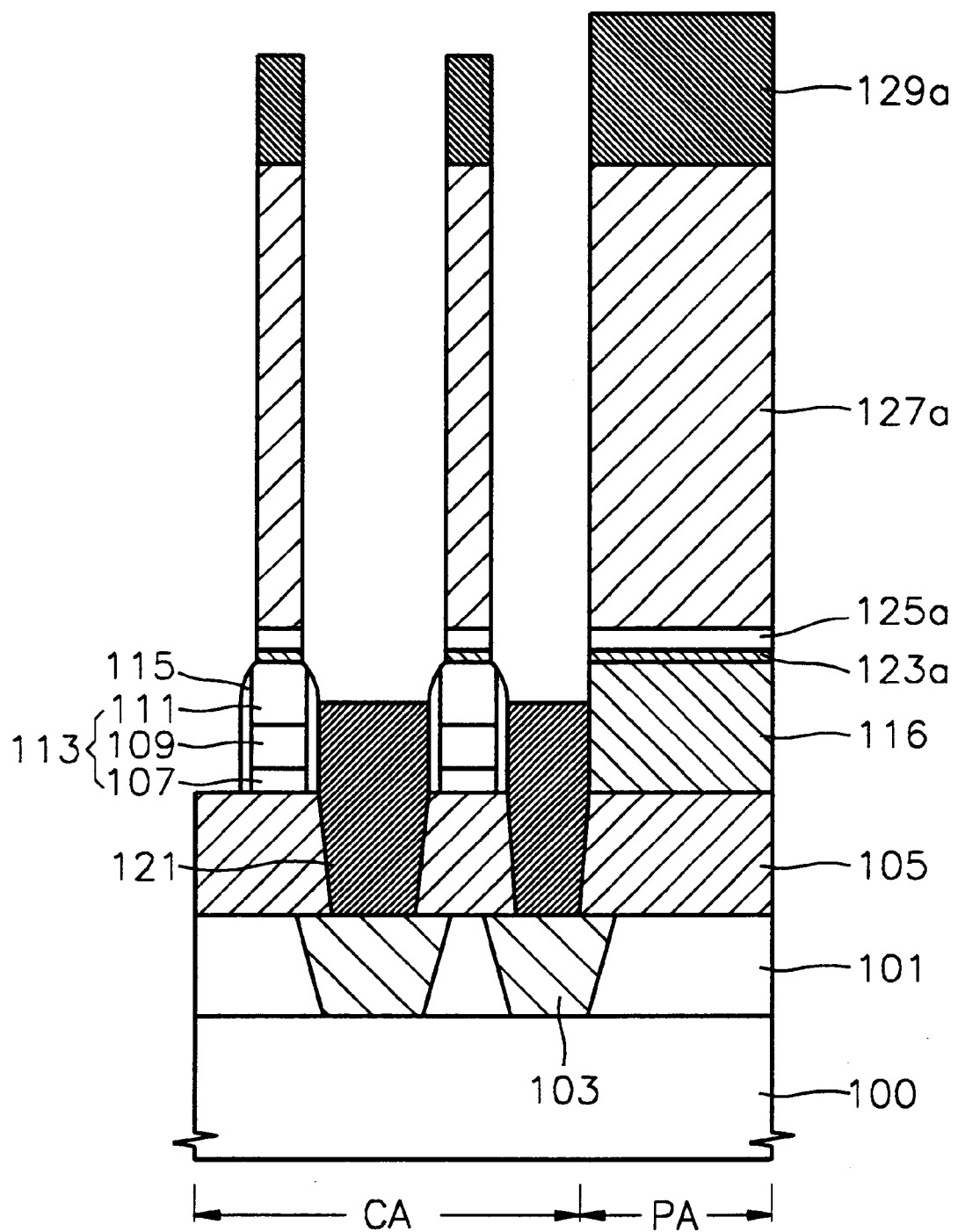

Referring to FIG. 5, the hard mask layer 129 is etched by using the second photoresist pattern 131 as an etch mask, and a hard mask layer pattern 129a is formed. As shown in FIG. 5, a step between the hard mask layer pattern 129a of the cell array area CA and the hard mask layer pattern 129a of the peripheral circuit area PA is formed due to a three-dimensional etching effect. After removing the second photoresist pattern 131, the mold layer 127 is etched by using the hard mask layer pattern 129a as an etch mask, and a mold layer pattern 127a is formed.

Then, the etch stop layer 125 is etched by using the hard mask layer pattern 129a as an etch mask, and an etch stop layer pattern 125a is formed. Then, the buffer layer 123 is etched by using the hard mask layer pattern 129a as an etch mask, so that a buffer layer pattern 123a is formed. It will be understood that the etchings of FIG. 5 may take place in one continuous process or in two or more discrete processes. Then, a portion of the plug 121 may be etched by using the hard mask layer pattern 129a as an etch mask so that the surface of the plug 121 becomes lower than the surface of the bit line capping layer 111.

As a result, the mold layer 127, the etch stop layer 125, and the buffer layer 123 are etched by using the hard mask layer pattern 129a as an etch mask, thereby forming the mold layer pattern 127a, the etch stop layer pattern 125a, and the buffer layer pattern 123a, exposing the surface of the plug 121.

In some embodiments, the mold layer 127, the etch stop layer 125, and the buffer layer 123 are etched by using the hard mask layer pattern 129a as an etch mask after removing the second photoresist pattern 131. However, in other embodiments, the mold layer 127, the etch stop layer 125, and the buffer layer 123 may be etched in the presence of the second photoresist pattern 131. Moreover, in some embodiments, the surface of the plug 121 is etched to be lower than the surface of the bit line capping layer 111. However, in other embodiments, the surfaces of the plug 121 and the bit line capping layer 111 may be aligned.

Figure 6:
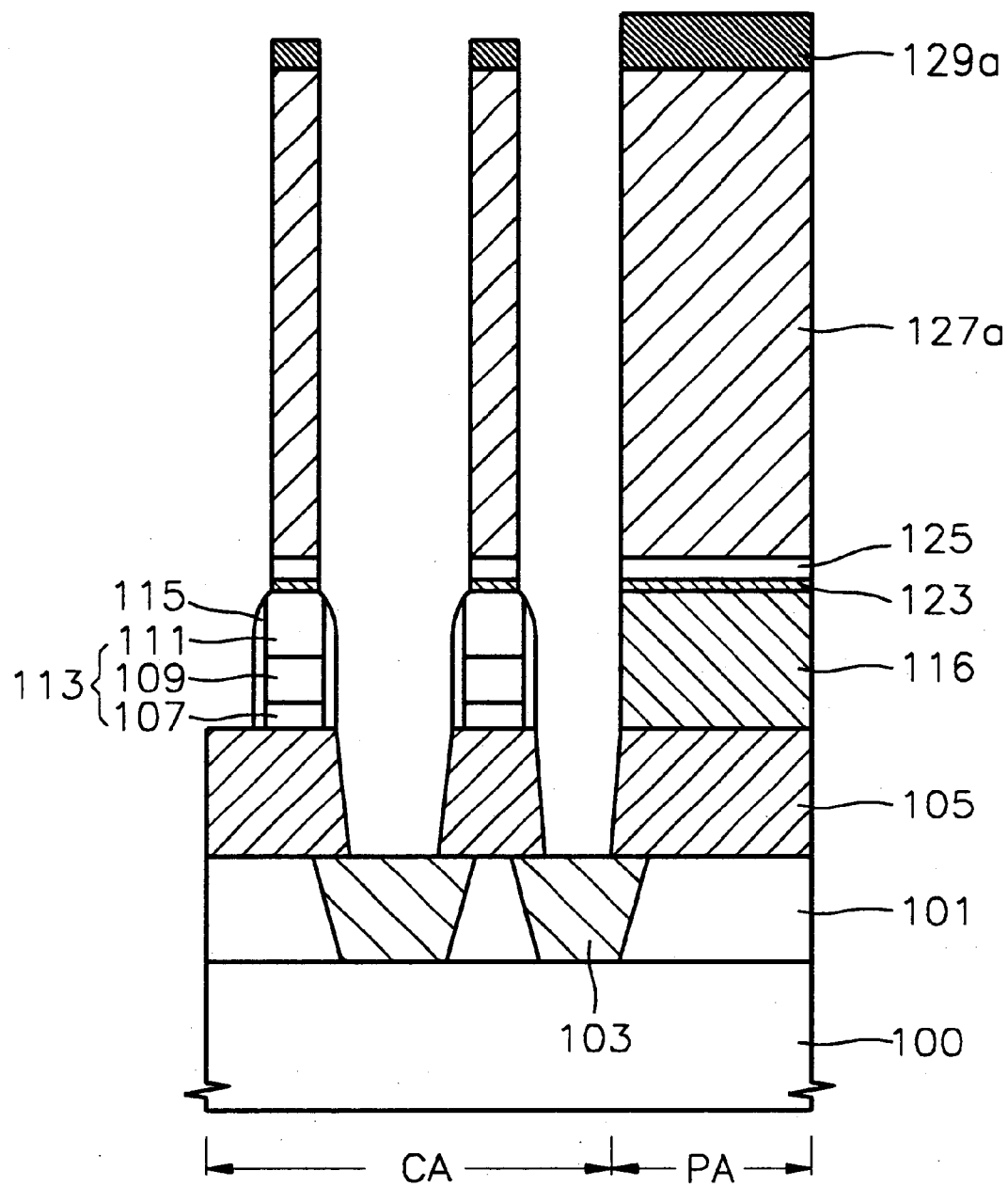

Referring to FIG. 6, the hard mask layer pattern 129a is dry- and/or wet-etched back so that the step between the hard mask layer pattern 129a of the cell array area CA and the hard mask layer pattern 129a of the peripheral circuit area PA is reduced. In some embodiments, the hard mask layer pattern 129a is completely removed. In other embodiments, as shown in FIG. 6, the step difference between the hard mask layer pattern 129a of the cell array area CA and the hard mask layer pattern 129a of the peripheral circuit area PA is reduced, for example to less than about 1000 Å.

By reducing the step between the hard mask layer pattern 129a of the cell array area CA and the hard mask layer pattern 129a of the peripheral circuit area PA, according to some embodiments of the invention, the height of the cylinder-type capacitor lower electrode may not shrink when separating the cylinder-type capacitor lower electrodes for the cells, and the cylinder-type capacitor lower electrodes may be well separated for the individual cells. In addition, in some embodiments of the invention, the hard mask layer pattern 129a is etched back to reduce the step between the cell array area CA and the peripheral circuit area PA so that an expensive chemical mechanical polishing (CMP) is not required.

When the hard mask layer pattern 129a is etched back, the plug 121 formed in the buried contact hole 119 is etched back so as to be removed from the buried contact hole 119. In other embodiments, a small portion of the plug 121 may remain in the buried contact hole 119. Regardless of whether the plug 121 does not remain in the buried contact hole 119 or a small portion of the plug 121 remains in the buried contact hole 119, the cylinder-type capacitor lower electrode may be stably formed. In addition, the surface area of the cylinder-type capacitor lower electrode may be enlarged, thus allowing increased capacitance.

Figure 7:
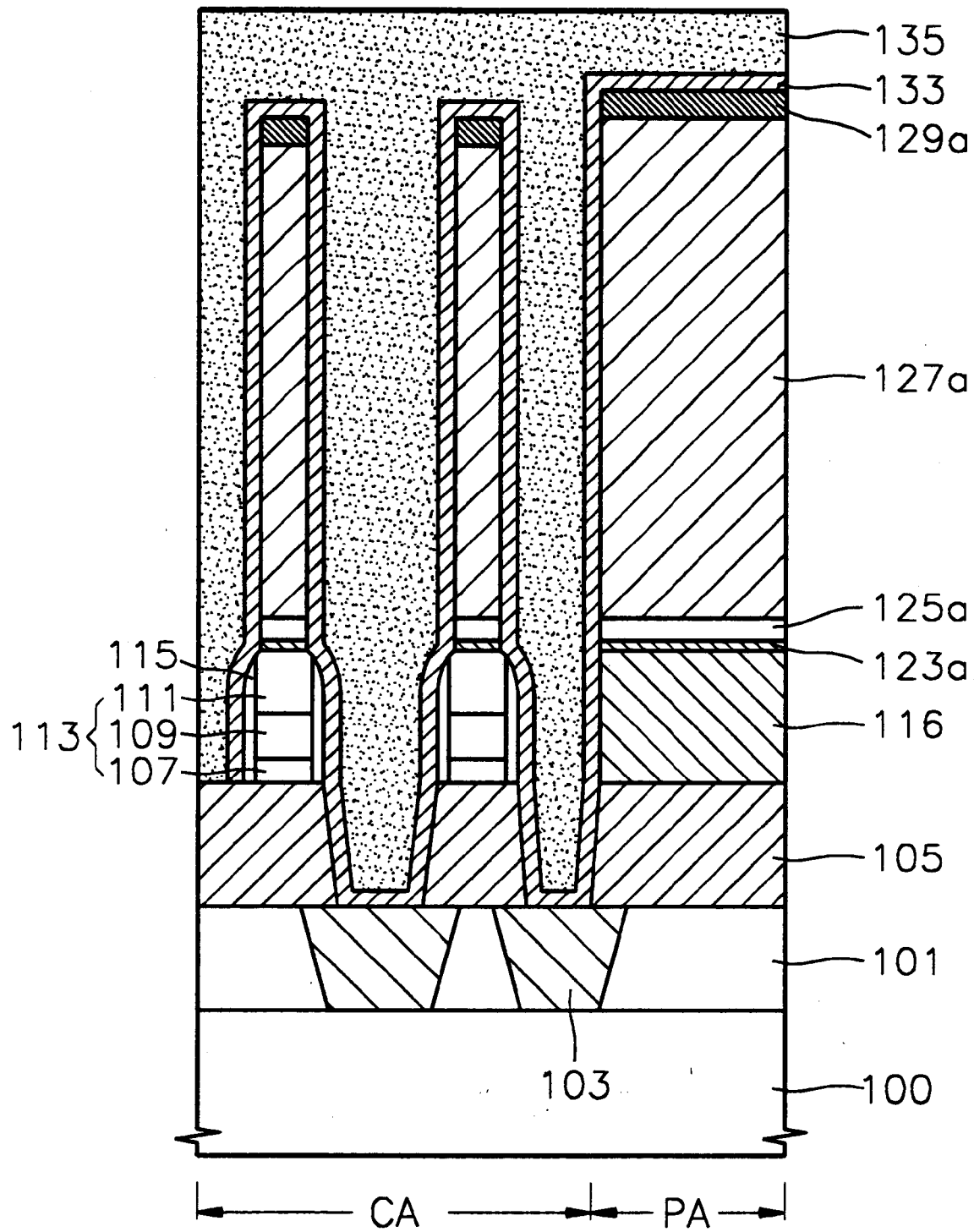

Referring to FIG. 7, a conductive layer 133 for the capacitor lower electrode, for example a polysilicon layer, is formed along the walls of the buried contact hole 119 and on the surface of the mold layer pattern 127a. Then, a sacrificial layer 135 is formed to sufficiently bury the space between the mold layer pattern 127a and the buried contact hole 119. In some embodiments, the sacrificial layer 135 comprises a silicon oxide layer and/or a photoresist layer.

Figure 8:
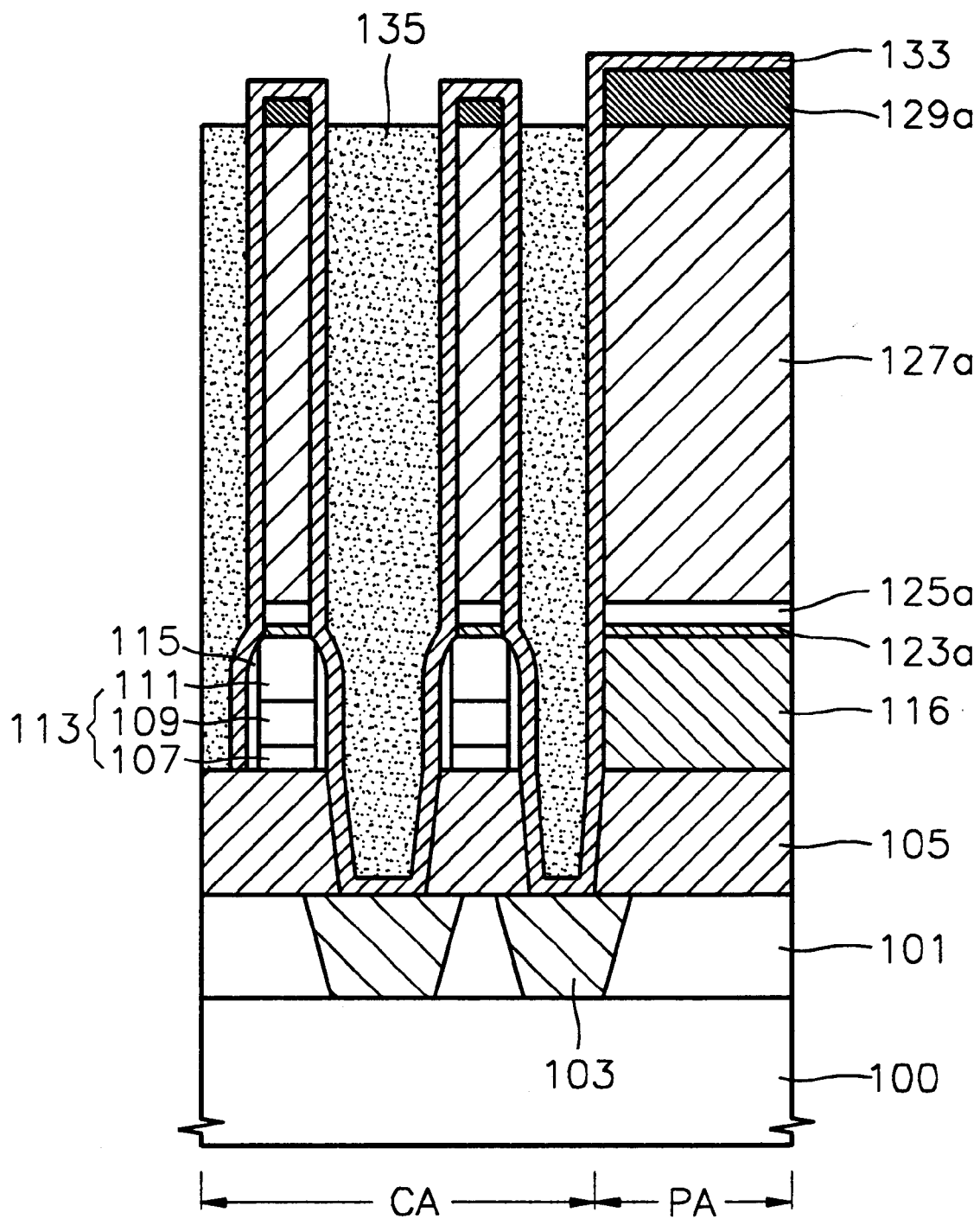

Referring to FIG. 8, the sacrificial layer 135 is dry- and/or wet-etched back. In some embodiments, the surface of the sacrificial layer 135 is aligned with or lower than the surface of the mold layer pattern 127a in consideration of a subsequent process step.

Figure 9:
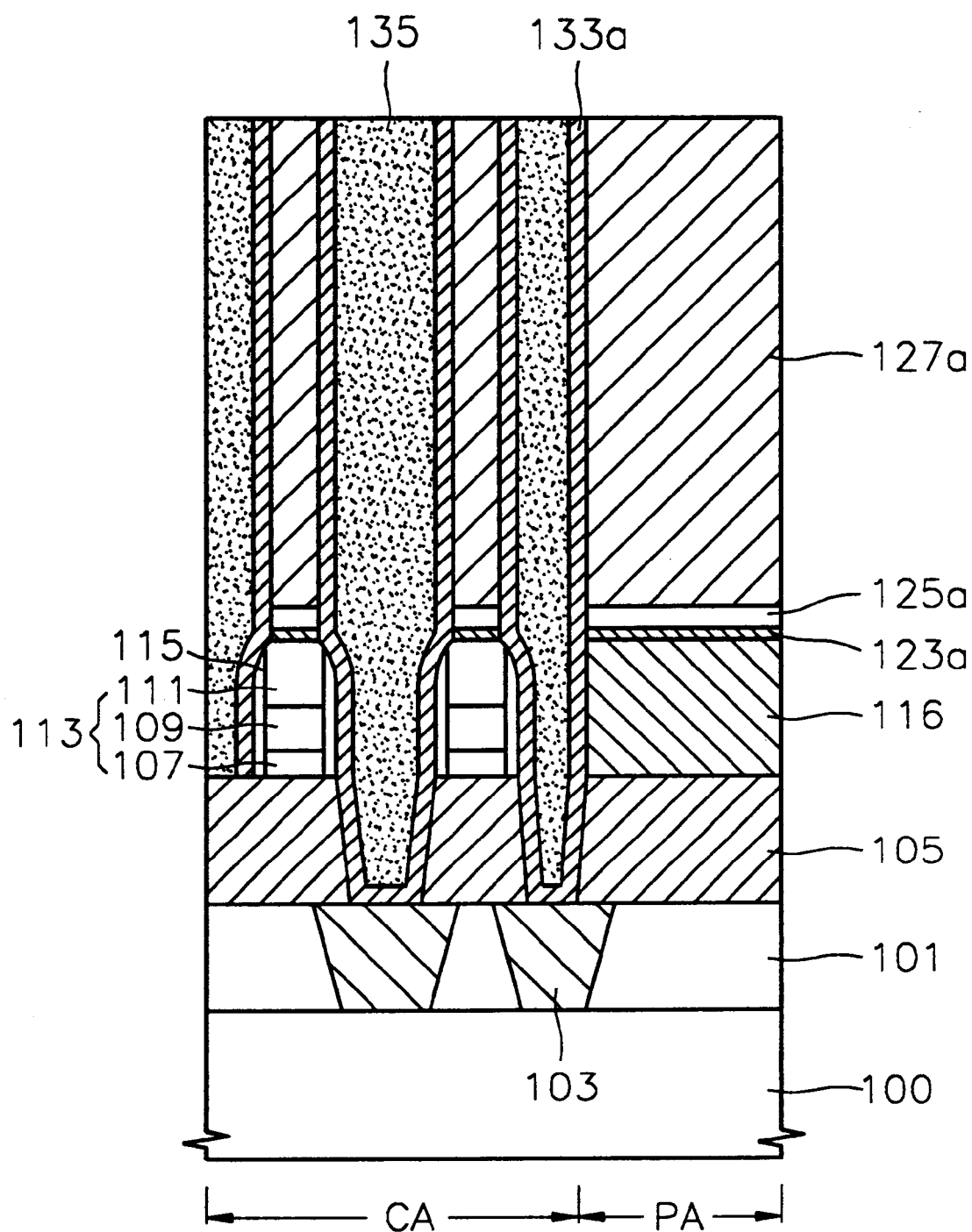

Referring to FIG. 9, the conductive layer 133 for the capacitor layer electrode and the hard mask layer pattern 129a are etched back by using the etched back sacrificial layer 135 as an etch stop point. Accordingly, the hard mask layer pattern 129a is removed, and a cylinder-type capacitor lower electrode 133a is formed.

Figure 10:
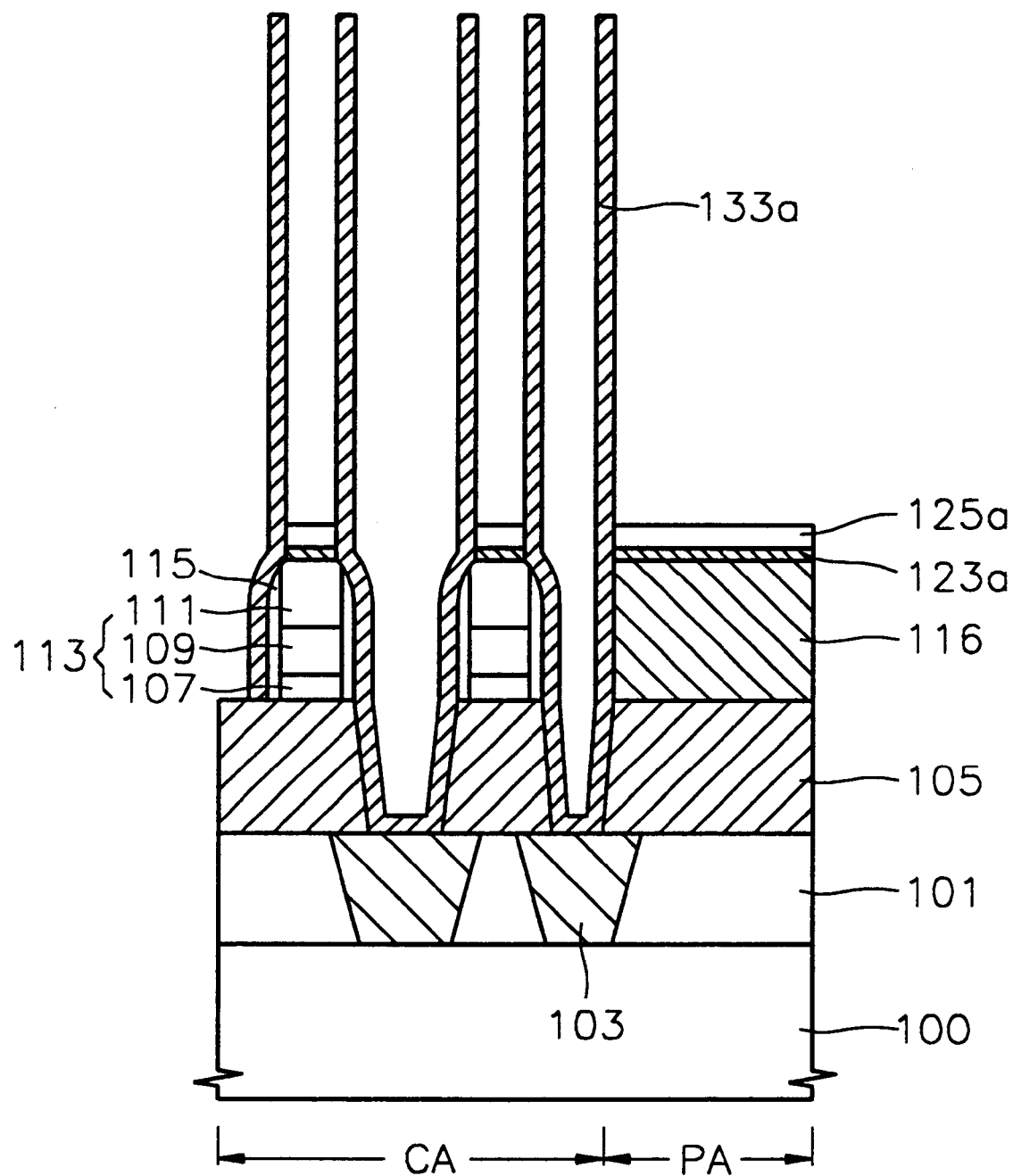
Figure 11:
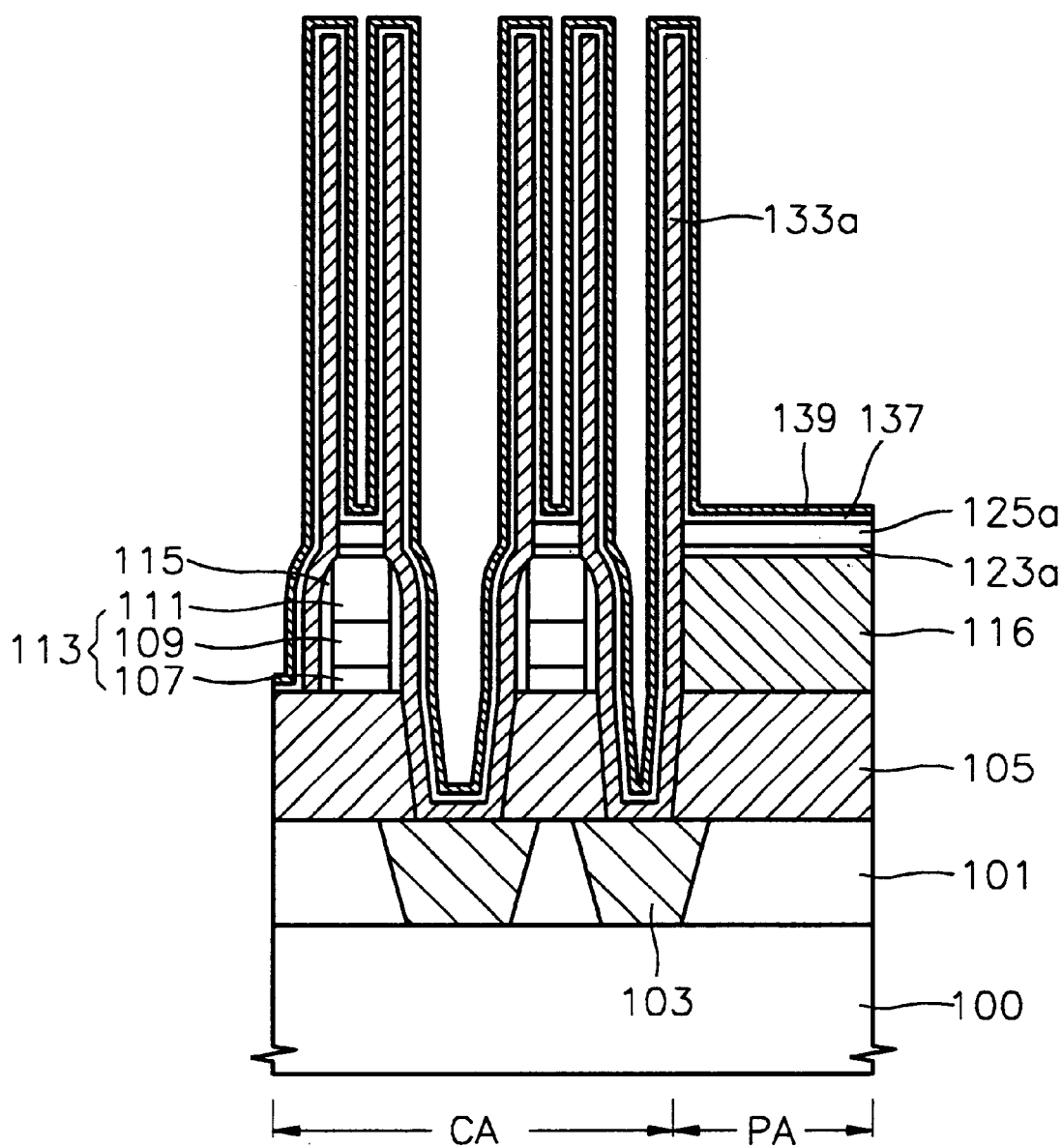

Referring to FIG. 10, the mold layer pattern 127a and the sacrificial layer 135 are removed by using the etch stop layer pattern 125a as an etch stop point. Thus, a cylinder-type capacitor lower electrode 133a is finally formed. Finally, referring to FIG. 11, a dielectric layer 137 and a capacitor upper electrode 139 are formed on the cylinder-type capacitor lower electrode 133a, to complete the cylinder-type capacitor.

As above-described, some embodiments of the present invention etch back the hard mask layer pattern when the cylinder-type capacitor lower electrode is formed by using the hard mask layer pattern, thereby allowing the step between the hard mask layer pattern of the cell array area and the hard mask layer pattern of the peripheral circuit area to be reduced. Accordingly, the height of the cylinder-type capacitor lower electrode may not be lowered when the cylinder-type capacitor lower electrode is separated for the individual cells, and the cylinder-type capacitor lower electrode can be well separated for the individual cells.

Moreover, in some embodiments, the step between the cell array area and the peripheral circuit area can be reduced by etching back the hard mask layer pattern so that an expensive CMP is not required.

In addition, in some embodiments, the cylinder-type capacitor lower electrode is formed in the buried contact hole, thereby stably forming the cylinder-type capacitor lower electrode and enlarging the surface area to allow increased capacitance.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A fabrication method for a cylinder-type capacitor in a semiconductor device, the fabrication method comprising:

successively forming an etch stop layer and a mold layer on a semiconductor substrate including a cell array area and a peripheral circuit area in which a plug in a buried contact hole is formed in the cell array area;

forming a hard mask layer pattern on the mold layer;

etching the mold layer and the etch stop layer by using the hard mask layer pattern as an etch mask to form a mold layer pattern and an etch stop layer pattern exposing a surface of the plug;

etching back the hard mask layer pattern to reduce a step between the hard mask layer pattern on the cell array area and the hard mask layer pattern on the peripheral circuit area;

forming a conductive layer for a capacitor lower electrode along the walls of the buried contact hole and on a surface of the mold layer pattern;

forming a sacrificial layer between the buried contact hole and the mold layer pattern;

forming a cylinder-type capacitor lower electrode by etching back the conductive layer for the capacitor lower electrode; and removing the mold layer pattern and the sacrificial layer.

2. The fabrication method of claim 1, wherein a buffer layer is additionally formed before forming the etch stop layer.

3. The fabrication method of claim 1, wherein the etch stop layer comprises a silicon nitride layer, and the mold layer comprises a silicon oxide layer.

4. The fabrication method of claim 3, wherein the mold layer is about 10,000 Å to about 20,000 Å thick.

5. The fabrication method of claim 1, wherein the forming a hard mask layer pattern comprises:

forming a hard mask layer on the mold layer;

forming a photoresist pattern on the hard mask layer; and etching the hard mask layer by using the photoresist pattern as an etch mask.

6. The fabrication method of claim 5, further comprising removing the photoresist pattern before the forming a mold layer pattern and an etch stop layer pattern.

7. The fabrication method of claim 1, wherein the hard mask layer pattern comprises a polysilicon layer.

8. The fabrication method of claim 1, wherein the plug is etched after forming the mold layer pattern and the etch stop layer pattern.

9. The fabrication method of claim 1, wherein the plug is removed when the hard mask layer pattern is etched back.

10. The fabrication method of claim 1, wherein a portion of the plug remains when the hard mask layer pattern is etched back.

11. The fabrication method of claim 1, wherein a portion of the hard mask layer pattern remains on the mold layer pattern when the hard mask layer pattern is etched back.

12. The fabrication method of claim 11, wherein the portion of the hard mask layer pattern remaining on the mold layer pattern is removed when the conductive layer for the capacitor lower electrode is etched back.

13. The fabrication method of claim 1, wherein the sacrificial layer comprises a photoresist layer and/or a silicon oxide layer.

14. The fabrication method of claim 1, wherein the sacrificial layer is etched back, after forming the sacrificial layer.

15. The fabrication method of claim 14, wherein a surface of the sacrificial layer that is remote from the substrate is aligned with or lower than a surface of the mold layer pattern that is remote from the substrate when the sacrificial layer is etched back.

16. A fabrication method for a capacitor in a semiconductor device, the fabrication method comprising:

forming a mold layer on a semiconductor substrate that includes a peripheral circuit area and a cell array area which includes a plug in a buried contact hole;

forming a hard mask layer pattern on the mold layer;

etching the mold layer using the hard mask layer pattern as an etch mask to form a mold layer pattern;

only partially etching back the hard mask layer pattern on the mold layer pattern;

forming a capacitor lower electrode along walls of the buried contact hole and on a surface of the mold layer pattern;

forming a capacitor dielectric layer on the capacitor lower electrode; and forming a capacitor upper electrode on the capacitor dielectric layer.

17. The fabrication method of claim 16 wherein the mold layer comprises a silicon oxide layer.

18. The fabrication method of claim 17, wherein the mold layer is between about 10,000 Å and about 20,000 Å thick.

19. The fabrication method of claim 16, wherein the hard mask layer pattern comprises a polysilicon layer.

20. The fabrication method of claim 16, wherein at least some of the plug is removed when the hard mask layer pattern is only partially etched back.

* * * * *